(12) United States Patent
Fainchtein et al.

(10) Patent No.: US 8,552,381 B2
(45) Date of Patent: Oct. 8, 2013

(54) AGILE IR SCENE PROJECTOR

(75) Inventors: Raul Fainchtein, Potomac, MD (US); David M. Brown, Ellicott City, MD (US); Christopher C. Davis, Bowie, MD (US)

(73) Assignee: The Johns Hopkins University, Baltimore, MD (US)

( * ) Notice: Subject to any disclaimer, the term of this patent is extended or adjusted under 35 U.S.C. 154(b) by 0 days.

(21) Appl. No.: 13/541,936

(22) Filed: Jul. 5, 2012

(65) Prior Publication Data

US 2013/0048884 A1   Feb. 28, 2013

Related U.S. Application Data

(60) Provisional application No. 61/505,709, filed on Jul. 8, 2011.

(51) Int. Cl.
| | | |
|---|---|---|
| H01L 27/14 | (2006.01) | |
| H01J 5/02 | (2006.01) | |
| H01J 1/14 | (2006.01) | |
| H01J 9/02 | (2006.01) | |
| G01J 5/02 | (2006.01) | |

(52) U.S. Cl.
CPC . *H01L 27/14* (2013.01); *H01J 1/14* (2013.01); *H01J 9/025* (2013.01); *G01J 5/02* (2013.01); *Y10S 977/75* (2013.01); *Y10S 977/752* (2013.01)
USPC ........ 250/338.4; 977/750; 977/752; 313/310; 313/309; 313/311

(58) Field of Classification Search
CPC ............. H01J 1/14; H01J 1/304; H01J 9/025; H01J 2201/30469; H01J 31/127; G01J 5/02; G01J 5/0853; H01L 27/14679
USPC .............. 250/338.4; 313/310, 309, 311, 493; 977/742, 750, 752
See application file for complete search history.

(56) References Cited

U.S. PATENT DOCUMENTS

| | | | |
|---|---|---|---|
| 6,400,088 B1 * | 6/2002 | Livingston et al. | 315/94 |
| 7,254,151 B2 * | 8/2007 | Lieber et al. | 372/44.01 |
| 7,448,931 B2 * | 11/2008 | Liu et al. | 445/24 |
| 7,537,505 B2 | 5/2009 | Shiroishi et al. | |
| 7,608,824 B2 * | 10/2009 | Korsah et al. | 250/338.4 |
| 7,880,376 B2 | 2/2011 | Takai et al. | |
| 8,048,397 B2 * | 11/2011 | Chen et al. | 423/447.3 |
| 8,070,548 B2 * | 12/2011 | Xiao et al. | 445/49 |
| 8,072,126 B2 * | 12/2011 | Chen et al. | 313/310 |

(Continued)

FOREIGN PATENT DOCUMENTS

| | | |
|---|---|---|
| WO | 03/084869 | 10/2003 |
| WO | 2005/114690 | 1/2005 |
| WO | 2011/022677 | 2/2011 |
| WO | 2011/116469 | 9/2011 |

*Primary Examiner* — David A Vanore
(74) *Attorney, Agent, or Firm* — Noah J. Hayward

(57) ABSTRACT

An infrared (IR) scene projector device includes a light emitter and a thermal emitter. The light emitter is configured to selectably provide visible light. The thermal emitter includes a vertically aligned carbon nanotube (VACN) array. The VACN array includes a plurality of carbon nanotubes disposed proximate to a thermally conductive substrate, such that a longitudinal axis of the carbon nanotubes extends substantially perpendicular to a surface of the substrate. The thermal emitter absorbs the visible light from the light emitter and converts the visible light from the light emitter into IR radiation.

20 Claims, 6 Drawing Sheets

(56) References Cited

U.S. PATENT DOCUMENTS

| | | | |
|---|---|---|---|
| 8,084,927 B2* | 12/2011 | Xiao et al. | 313/310 |
| 8,110,883 B2* | 2/2012 | Ward et al. | 257/428 |
| 2003/0170166 A1* | 9/2003 | Smalley et al. | 423/447.1 |
| 2007/0006583 A1* | 1/2007 | Veneruso | 60/508 |
| 2008/0251723 A1* | 10/2008 | Ward et al. | 250/338.4 |
| 2009/0258448 A1* | 10/2009 | Xiao et al. | 438/20 |
| 2010/0053931 A1* | 3/2010 | Carroll et al. | 362/84 |
| 2010/0209632 A1* | 8/2010 | Weisman et al. | 428/29 |
| 2011/0045169 A1* | 2/2011 | Maruyama et al. | 427/71 |
| 2011/0180385 A1* | 7/2011 | Imholt | 204/157.15 |
| 2013/0137324 A1* | 5/2013 | Tang | 442/131 |

\* cited by examiner

AGILE IR SCENE PROJECTOR

CROSS-REFERENCE TO RELATED APPLICATIONS

This application claims priority to and the benefit of U.S. Provisional Application No. 61/505,709 filed on Jul. 8, 2011, the entire contents of which are hereby incorporated herein by reference.

TECHNICAL FIELD

Example embodiments generally relate to scene projector devices and, more particularly, relate to an infrared (IR) light emitters and scene projectors employing vertically aligned carbon nanotubes (VACN).

BACKGROUND

IR scene projectors (IRSPs) are used to emulate realistic scenarios to enable IR imaging systems to be investigated and/or tested. For example, IR imaging systems and IR imaging systems that may be employed in connection with IR guided weapons and/or countermeasures may be tested in the laboratory using IRSPs.

Current IR radiation is typically generated based using resistive heaters, light emitting diodes (LED's) or IR LASERS. In the case of IRSP IR radiation generation is based on arrays (e.g., 512×512 or 1024×1024) of miniature (e.g., 50 μm-square) resistive heater elements controlled in real time to display varying and/or complex IR scenes to a system under test. However, it is expected that future IR imaging systems and detectors will have larger and faster focal plane arrays and faster IR sensors. Thus, in order to accommodate the performance and oversampling demands associated with testing of larger and faster focal plane array IR sensors, and other IR detectors improved IR emitters and IRSPs will likely be required.

BRIEF SUMMARY OF SOME EXAMPLES

Accordingly, some example embodiments may enable the provision of an IRSP that may be provided in a larger size and may also maintain a faster frame refresh rate than current resistive heater technology based IRSPs are able to provide. Some example embodiments may provide relatively faster rise and fall times than those that are achievable with resistive heater technology. In some cases, by projecting scenarios in the visible or near-IR onto VACN, example embodiments have been enabled to produce broad-band black-body like IR emission resulting from absorption and heating of the VACN.

In one example embodiment, an infrared (IR) scene projector device is provided. The IR scene projector device may include a light emitter and a thermal emitter. The light emitter may be configured to selectably provide visible or near infrared light to stimulate IR light emission. The thermal emitter may include a vertically aligned carbon nanotube (VACN) array. The VACN array may include a plurality of carbon nanotubes disposed proximate to a thermally conductive substrate such that a longitudinal axis of the carbon nanotubes extends substantially perpendicular to a surface of the substrate. The thermal emitter may absorb the visible light from the light emitter and convert the visible light from the light emitter into IR radiation.

According to another example embodiment, a thermal emission array is provided. The thermal emission array may include a thermally conductive substrate and a plurality of vertically aligned carbon nanotubes (VACN). The carbon nanotubes may be disposed proximate to the thermally conductive substrate such that a longitudinal axis of the carbon nanotubes extends substantially perpendicular to a surface of the substrate. The carbon nanotubes may be configured to convert visible light directed thereon into IR radiation such that the IR radiation being emitted by thermal emission array is based on selective provision of the visible light to the VACN.

BRIEF DESCRIPTION OF THE SEVERAL VIEWS OF THE DRAWING(S)

Having thus described example embodiments of the invention in general terms, reference will now be made to the accompanying drawings, which are not necessarily drawn to scale, and wherein:

FIG. 1, which includes FIGS. 1A and 1B, illustrates portions of a model VACN array that may be produced as a mat or coating to be disposed proximate to a substrate according to an example embodiment;

DETAILED DESCRIPTION

Figure 1A:
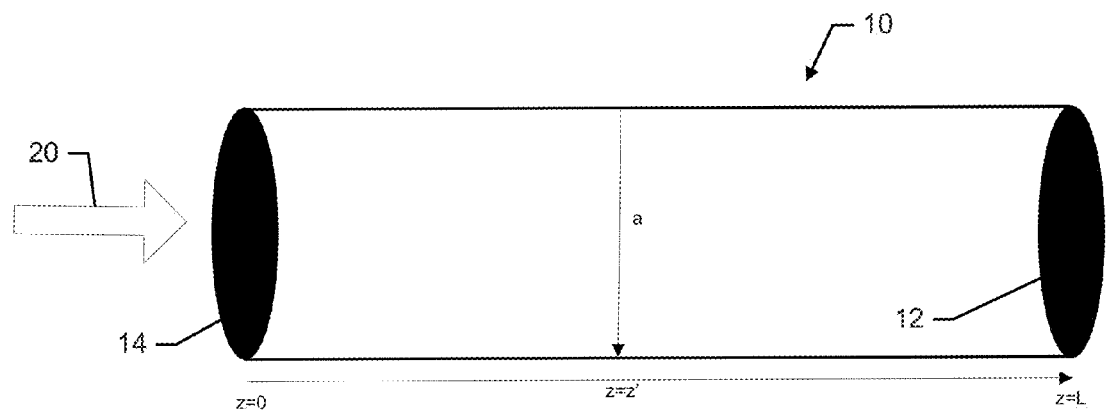

Some example embodiments now will be described more fully hereinafter with reference to the accompanying drawings, in which some, but not all example embodiments are shown. Indeed, the examples described and pictured herein should not be construed as being limiting as to the scope, applicability or configuration of the present disclosure. Rather, these example embodiments are provided so that this disclosure will satisfy applicable legal requirements. Like reference numerals refer to like elements throughout.

Some example embodiments may improve the ability to perform testing relative to simulated infrared (IR) environments. In this regard, for example, some example embodiments may provide an agile IR scene projector that may be capable of simulating any of a number of IR environments under synthetic conditions. Example embodiments may therefore be useful in connection with testing surveillance cameras or other IR devices that may be used in association with weaponry and/or countermeasures. Some embodiments may employ projection of scenarios in the visible or near-IR spectrum onto a vertically aligned carbon nanotube (VACN) array to produce black-body like IR emission resulting from absorption and heating of the VACN array. Such VACN arrays have been demonstrated to have a higher absorptivity than conventional black paint or even "carbon black."

VACN arrays have a thermal conductivity parallel to the VACN axis that is much larger than their thermal conductivity perpendicular to the axis. Because of the relatively large length-to-radius ratio of VACNs, they can be assumed to have the same temperature in any cross section that is perpendicular to the tube axis. Consequently, a pulsed-laser irradiated VACN array may be enabled to produce fast thermal emissions from the end-face of the VACN array frown on a highly thermally conductive substrate. This situation may be represented as a one-dimensional thermal conductivity problem, where the proximal end of the carbon nanotubes (CNTs) jumps in temperature when irradiated with a pulsed laser, and the tubes then cool by thermal conduction down their axis to their distal end on a substrate where the temperature is fixed.

The time-dependent IR emission from a range of VACNs according to an example embodiment that were grown on a substrate (e.g., an aluminum-nitride AlN substrate or a cooper substrate or a silicon-carbide substrate) have been measured and calculated analytically. Spectral reflectance and emissivity of single-wavelength bidirectional reflectance distribution functions (BRDFs) of these arrays have also been measured. The BRDF reveals non-directional Lambertian behavior. The optical characteristics of these arrays compare favorably to ideal black-body behavior. Moreover, the length of the CNT can be adjusted in order to control the response time relative to cooling speeds after removal of excitation. Thus, for example, a VACN array according to an example embodiment may provide a relatively fast on-off black-body source, which may be useful in any number of applications for which a broadband IR source having a fast response time is desirable.

Figure 1B:
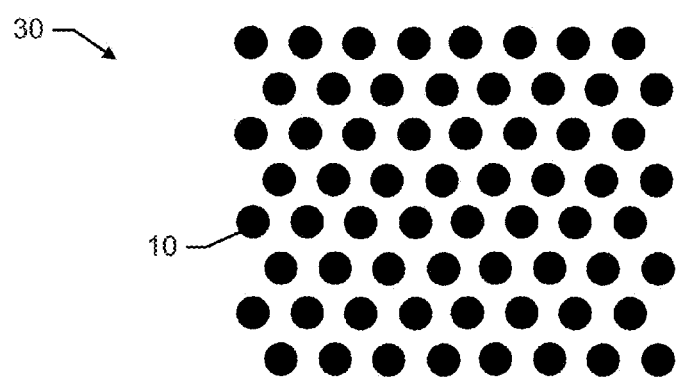

FIG. 1, which includes FIGS. 1A and 1B, illustrates a schematic representation of a modeled VACN array that may be produced as a mat or coating to be disposed proximate to a substrate. FIG. 1A illustrates a side view of a single CNT 10 according to an example embodiment. The CNT 10 may have a proximal end 12 that may be disposed proximate to a substrate (not shown), and a distal end 14 that may be disposed spaced apart from the substrate by a distance L, where L is the longitudinal length of the CNT 10. The CNT 10 may extend perpendicularly away from a surface of the substrate. In this example, the length of the CNT 10 may be greater than or equal to about 10 µm and the diameter, a, of the CNT 10 may be less than or equal to about 30 nm.

As shown in FIG. 1A, a light pulse 20 may enter into the distal end 14 of the CNT 10 at a point z=0. The light pulse 20 may be absorbed at the distal end and produce a heat pulse. The absorbed light may move as heat from the point z=0 toward the substrate where z=L very quickly. FIG. 1B shows a top view of a plurality of CNTs 10 viewed from their respective distal ends and looking down their longitudinal axes toward the substrate. The VACN array 30 created by the CNTs 10 may include a plurality of vertically aligned cylinders of very high aspect ratio that can be irradiated at one end and convert light to heat that quickly moves toward the substrate. The heat profile of any particular cross section (e.g., at point z') may be consistent across the entirety of the VACN array 30. In an example embodiment, the substrate may be a thermally conductive material capable of dissipating heat quickly. As indicated above, in some embodiments, the substrate may be an aluminum-nitride AN substrate, a copper substrate, a silicon-carbide substrate, or a silicon-dioxide-silicon ($SiO_2$/Si) substrate.

Figure 2:
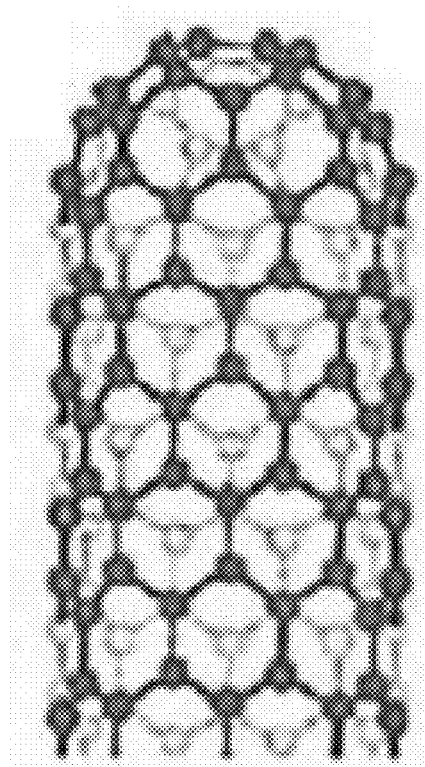
FIG. 2 illustrates a carbon nanotube structure defined by a hollow cylinder composed of carbon molecules according to an example embodiment.

Generally speaking, absorbance of the VACN array 30 increases with CNT 10 length, with infinitely long tubes being perfect absorbers. Some embodiments may present weak scattering of light from the surface of the CNTs 10 attributable to the fact that the CNTs 10 have a low volume fraction compared to the air spaces (or gaps) between tubes, so that the effective refractive index of the array is close to unity. Because of the small distance between adjacent tubes in the VACN array 30, which is much smaller than the wavelength of a typical illuminating laser, and the relatively high electrical conductivity of the CNTs 10, incident radiation will generally not penetrate very far beyond the end face of the CNTs 10 of the VACN array 30. The CNTs 10 have a structure composed of multiple concentric tubes, an example of which is shown in FIG. 2, which defines a hollow cylinder composed of carbon molecules. Notably, FIG. 2 represents a single-walled carbon nanotube. However, example embodiments may alternatively be embodied as multi-walled carbon nanotubes composed of multiple concentric tubes capped or truncated at the free end. Embodiments with single walled carbon nanotubes are possible if the chirality of the composing tubes is such that the tubes are metallic and therefore good thermal conductors in their axial direction. Referring now to FIG. 2, a diameter of the outer cylinder may be on the order of about 1 nm to about 100 nm, while a length of the cylinder may be up to several µm. This structure enables the CNT 10 to conduct heat very efficiently along its longitudinal axis. Thus, the CNT 10 rapidly transfers heat to the substrate and cools rapidly after irradiation (e.g., via a laser or other device) of a specific region is suspended.

Given the high absorbance of the CNT 10, irradiation of the VACN array 30 with a short pulse will cause the surface of the array to be heated almost instantaneously. The absorption of the laser energy at the end faces of the CNT 10 (e.g., the distal ends 14) produces an extremely fast jump in temperature of a thin layer at the end face. Emission from the end face of the array is a function of end face temperature. As the heat is conducted rapidly away from the end face and down the axis of the CNT 10 (e.g., toward the substrate), the end faces cool rapidly after the laser pulse ceases, thereby leading to fast decay of the emission.

Figure 3:
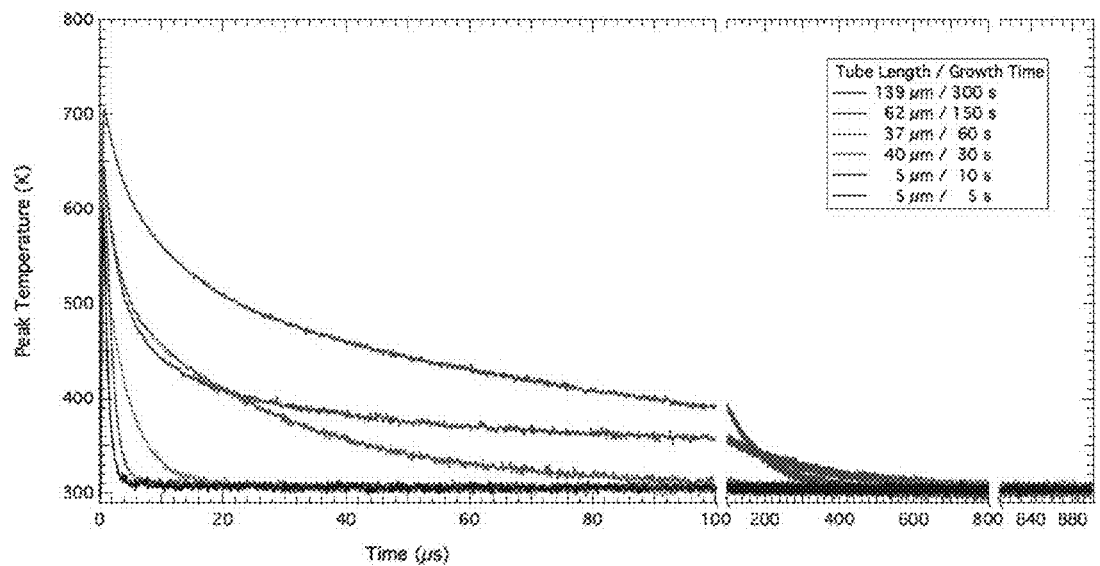
FIG. 3 illustrates a graph of measured IR emission peak temperatures versus time for different tube lengths to demonstrate the fast rise and fall time of the IR emission in these materials according to an example embodiment.
Figure 4:
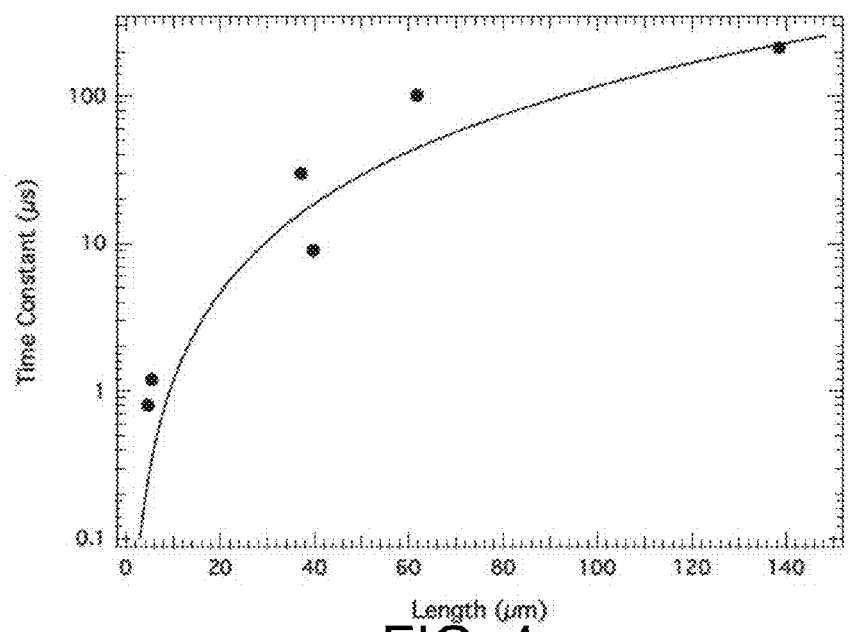
FIG. 4 illustrates a quadratic fit to dominant experimental time constant vs. CNT length according to an example embodiment.

In various embodiments, the decay of temperature responsive to removal of the light source may be impacted by the length of the CNT 10, thermal diffusivity values associated with the CNT 10, and boundary conditions encountered. The thermal signatures for CNTs of differing lengths grown on AlN, for example, may generally fit to a function of three exponentials. However, for CNTs shorter than 60 µm, a double or single exponential plus a small constant value may fit well. In one example embodiment, an effective axial diffusivity of $(8.5+/-3) \times 10^{-5}$ $m^2 s^{-1}$ may be experienced in a situation where the thermal time constant, τ, of the tubes takes the form $\tau = L^2/\kappa$, where L is tube length and κ is thermal diffusivity. The existence of multiexponential behavior may be explained due to: 1) the incident radiation being absorbed in a short proximal region of the tube near the irradiated face, and the short region may conduct heat rapidly into adjacent unheated regions of the tube according to a first time constant, 2) the whole tube may become heated, contributing to a second time constant, and 3) the tubes may dump their heat into the substrate, giving a third time constant. FIG. 3 illustrates a graph of IR emission versus time for different tube lengths to demonstrate the fast rise and fall time of the IR emission in these materials. FIG. 4 illustrates a quadratic fit to dominant experimental decay time constant vs. CNT length for the first exponential decay.

Figure 5:
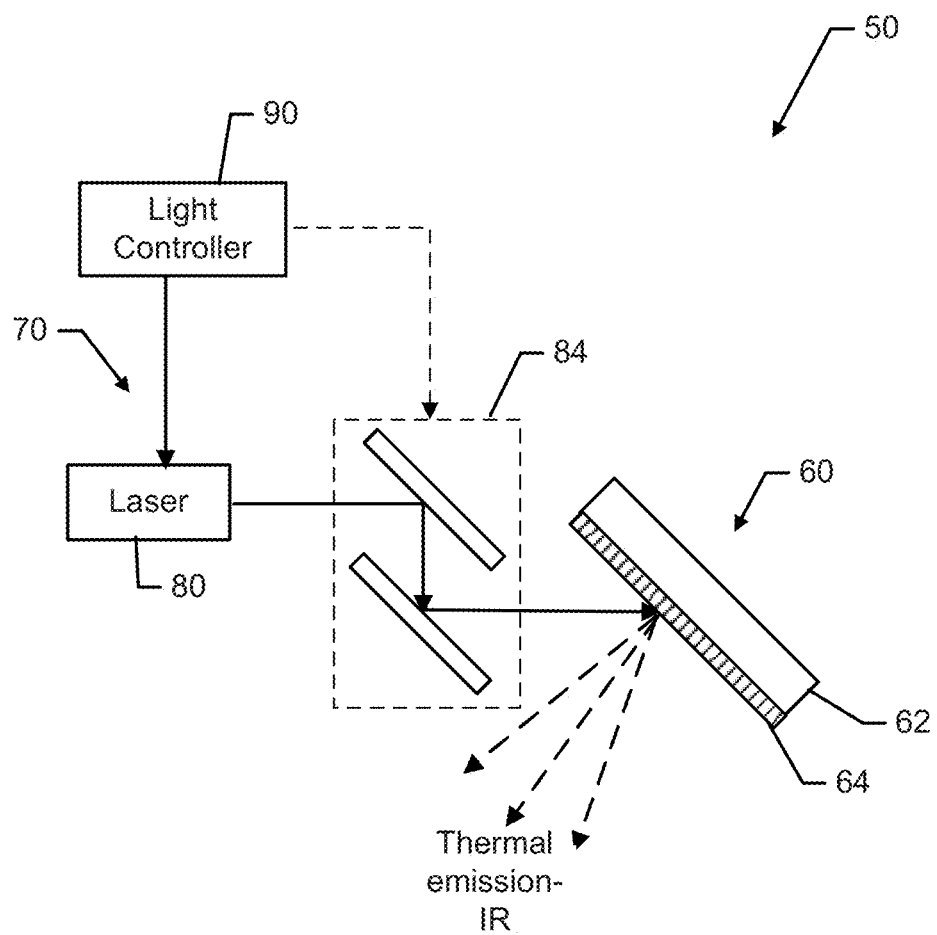
FIG. 5 illustrates a diagram of an IR scene projector according to an example embodiment.

FIG. 5 illustrates a diagram of an IR scene projector 50 of an example embodiment. The IR scene projector 50 may include a thermal emitter 60 and a light emitter 70. In an example embodiment, the thermal emitter 60 may include a conductive substrate 62 with a VACN layer 64 applied to a surface thereof. The substrate 62 may be a material that is capable of rapidly dissipating heat that is communicated thereto by the VACN layer 64. The VACN layer 64 may form a VACN array (e.g., VACN array 30) made from a plurality of vertically aligned CNTs (e.g., CNT 10). The VACN layer 64 may be configured to heat rapidly responsive to illumination by the light emitter 70 and cool rapidly by thermal conduction to the substrate 62 after the illumination is interrupted.

In an example embodiment, the substrate 62 may be an AlN substrate, a copper substrate, a silicon-carbide substrate, or a silicon-dioxide-silicon ($SiO_2$/Si) substrate. The VACN may then be grown on the substrate 62 by any of a plurality of different recipes or methods. In the case of thermal growth, generally speaking, the longer the growth time, the more the CNTs form a vertically aligned mat. Arrays thermally grown in a short time are less ordered in the vertical direction. Individual tubes may not necessarily be exactly straight (e.g., some may meander in the radial direction. The diameter of some tubes may vary from about 6 nm to about 20 nm. This is not the case in the presence of an electric field such as plasma-assisted growth. For that embodiment tubes are quite strait at all lengths. Single or multi-walled tubes may be employed in different embodiments.

The light emitter 70 may include a laser 80 and a scanning system 84. In an example embodiment, the laser 80 may be a pulsed laser such as, for example a pulsed Nd:YAG laser operating at 1.06 µm so that spatial detail that can be written in the VACN layer 64 may be on the micrometer scale. However, other lasers could be employed in alternative embodiments. In this regard, the light emitter 70 may be a point source in some embodiments. However, other embodiments may employ an expanded or parallel source. As such, virtually any desirable pixel size may be supported with respect to provision of the light emitter 70 so that even fast broadband emissions may be employed. Another embodiment may project an expanded beam spatially encoded in intensity by an image or desired scene. Such is the case when reflecting an expended beam from a spatial modulator.

Meanwhile, the scanning system 84 may be embodied as a galvo scanner, a mask, or any of a number of other devices via which various patterns of light may be controlled as they are provided by the light emitter 70 and directed toward the thermal emitter 60. In an example embodiment, a light controller 90 may be used to control the pulsing of the laser 80 and/or the operation of the scanning system 84 in order to enable image encoding or the development of an illumination pattern. As such, the light controller 90 may be employed to control pulsed operation of the laser 80, control application of a mask, control scanning, or in instances where a parallel source array is employed, the light controller 90 may control encoding of images and/or patterns emitted by the light emitter 70. Two dimensional thermal patterns may therefore be written onto the VACN layer 64 under the control of the light controller 90. Moreover, in some embodiments, the thermal signature may be varied by controlling laser pulse energy.

Figure 6:
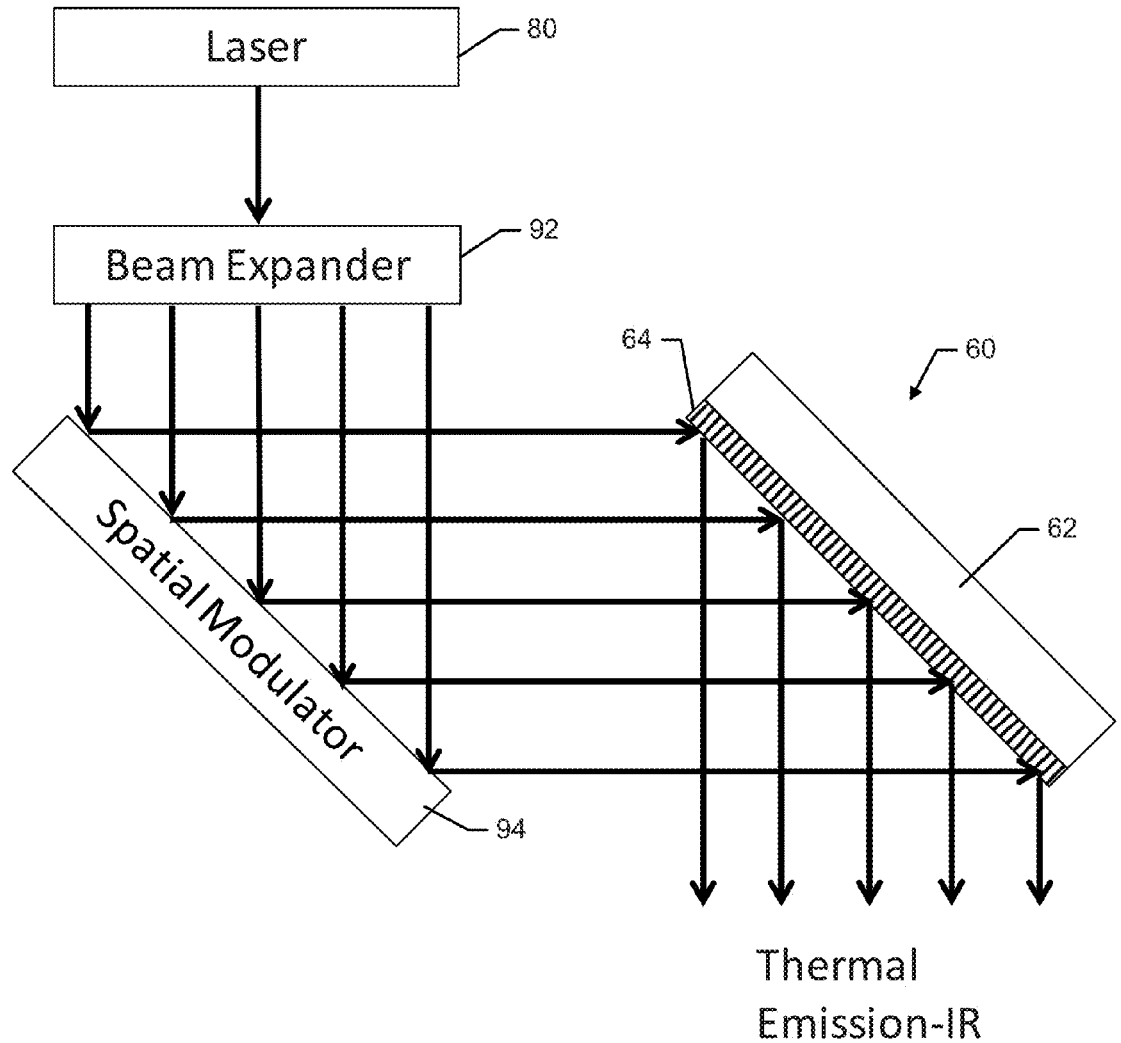
FIG. 6 illustrates a diagram of an IR scene projector according to an example embodiment.
Figure 7:
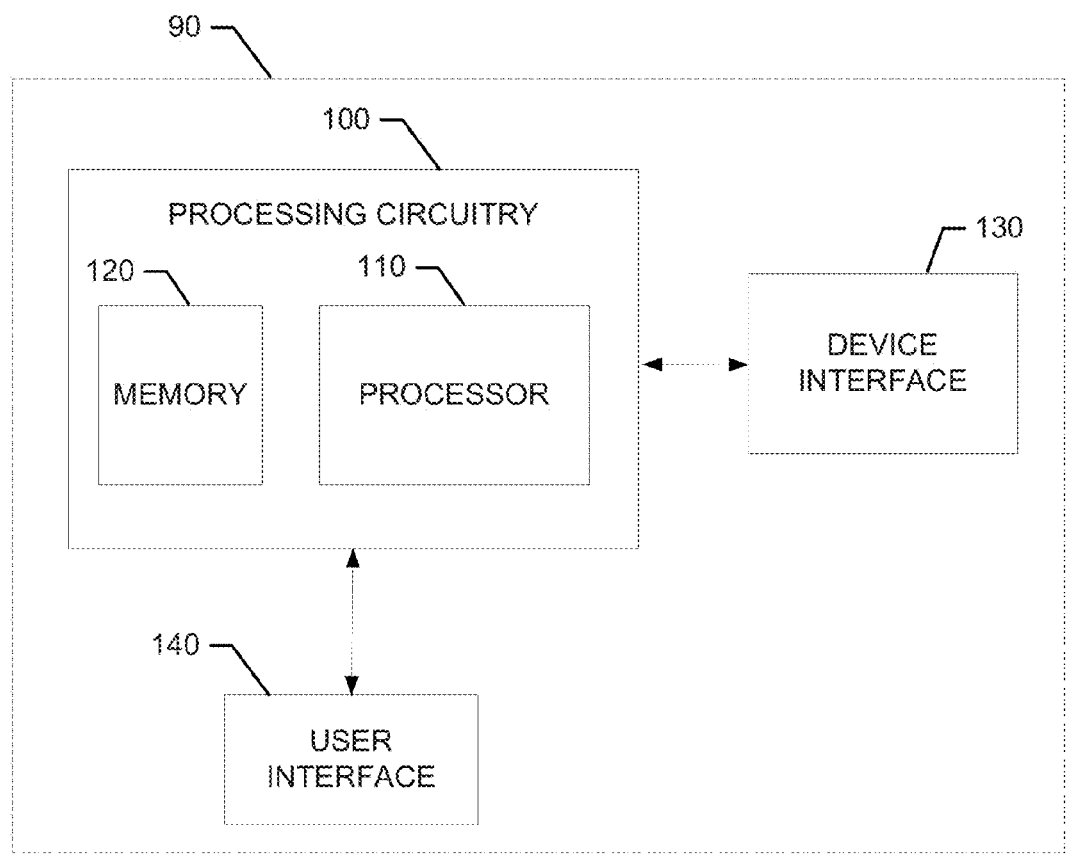
FIG. 7 illustrates a block diagram of one instance of the light controller according to an example embodiment.

The light controller 90 may be a computer controlled device, and in some embodiments may be programmable to define patterns or encoding schemes that may be desirable for IR scene simulation. FIG. 7 illustrates a block diagram of one instance of the light controller 90 according to an example embodiment. However, alternate structures to that which is shown in FIG. 5 are also possible. In this regard, FIG. 6 illustrates a diagram of an IR scene projector according to an alternative example. In this regard, in the example of FIG. 6, the laser 80 may be provided to direct a laser beam toward a beam expander 92. The expanded beam from the beam expander 92 may then be provided to a spatial modulator 94, which may provide modulation to the received input. The output of the spatial modulator 94 may then be provided to the thermal emitter 60. As indicated above, the thermal emitter 60 may include the substrate 62 and the VACN layer 64 to absorb light provided by the spatial modulator 92 and emit thermal emissions according to the modulations provided to the light by the spatial modulator 94.

As shown in FIG. 7, the light controller 90 may include may include or otherwise be in communication with processing circuitry 100 that is configurable to perform actions in accordance with example embodiments described herein. As such, for example, the functions attributable to the light controller 90 may be carried out by the processing circuitry 100.

The processing circuitry 100 may be configured to perform data processing, control function execution and/or other processing and management services according to an example embodiment of the present invention. In some embodiments, the processing circuitry 100 may be embodied as a chip or chip set. In other words, the processing circuitry 100 may comprise one or more physical packages (e.g., chips) including materials, components and/or wires on a structural assembly (e.g., a baseboard).

In an example embodiment, the processing circuitry 100 may include one or more instances of a processor 110 and memory 120 that may be in communication with or otherwise control a device interface 130 and, in some cases, a user interface 140. As such, the processing circuitry 100 may be embodied as a circuit chip (e.g., an integrated circuit chip) configured (e.g., with hardware, software or a combination of hardware and software) to perform operations described herein.

The user interface 140 (if implemented) may be in communication with the processing circuitry 100 to receive an indication of a user input at the user interface 140 and/or to provide an audible, visual, mechanical or other output to the user. As such, the user interface 140 may include, for example, a display, one or more buttons or keys (e.g., function buttons), and/or other input/output mechanisms (e.g., keyboard, microphone, speakers, cursor, joystick, lights and/or the like).

The device interface 130 may include one or more interface mechanisms for enabling communication with other devices (e.g., the laser 80 and/or the scanning system 84). In some cases, the device interface 130 may be any means such as a device or circuitry embodied in either hardware, or a combination of hardware and software that is configured to receive and/or transmit data from/to devices in communication with the processing circuitry 100.

In an exemplary embodiment, the memory 120 may include one or more non-transitory memory devices such as, for example, volatile and/or non-volatile memory that may be either fixed or removable. The memory 120 may be configured to store information, data, applications, instructions or the like for enabling the light controller 90 to carry out various functions in accordance with exemplary embodiments of the present invention. For example, the memory 120 could be configured to buffer input data for processing by the processor 110. Additionally or alternatively, the memory 120 could be configured to store instructions for execution by the processor 110. As yet another alternative, the memory 120 may include one or more databases that may store a variety of data sets indicative of patterns and/or encoding schemes to be employed. Among the contents of the memory 120, applications may be stored for execution by the processor 110 in order to carry out the functionality associated with each respective application. In some cases, the applications may include directions for control of the laser 80 and/or the scanning system 84 to achieve patterns and/or encoding schemes that are desired for various IR scenes that are to be simulated.

The processor 110 may be embodied in a number of different ways. For example, the processor 110 may be embodied as various processing means such as one or more of a microprocessor or other processing element, a coprocessor, a controller or various other computing or processing devices including integrated circuits such as, for example, an ASIC (application specific integrated circuit), an FPGA (field programmable gate array), or the like. In an example embodiment, the processor 110 may be configured to execute instructions stored in the memory 120 or otherwise accessible to the processor 110. As such, whether configured by hardware or by a combination of hardware and software, the processor 110 may represent an entity (e.g., physically embodied in circuitry—in the form of processing circuitry 100) capable of performing operations according to embodiments of the present invention while configured accordingly. Thus, for example, when the processor 110 is embodied as an ASIC, FPGA or the like, the processor 110 may be specifically configured hardware for conducting the operations described herein. Alternatively, as another example, when the processor 110 is embodied as an executor of software instructions, the instructions may specifically configure the processor 110 to perform the operations described herein.

In an example embodiment, the processor 110 (or the processing circuitry 100) may be embodied as, include or otherwise control the light controller 90. As such, in some embodiments, the processor 110 (or the processing circuitry 100) may be said to cause each of the operations described in connection with the light controller 90 by directing the light controller 90 to undertake the corresponding functionalities responsive to execution of instructions or algorithms configuring the processor 110 (or processing circuitry 100) accordingly.

Example embodiments may therefore enable the provision of an IR scene projector that may convert visible light into an IR emission. In this regard, some embodiments may include a light emitter and a thermal emitter. The light emitter may be configured to selectably provide visible light. The thermal emitter may include a VACN array. The VACN array may include a plurality of carbon nanotubes disposed proximate to a thermally conductive substrate such that a longitudinal axis of the carbon nanotubes extends substantially perpendicular to a surface of the substrate. The thermal emitter may convert the visible light from the light emitter into IR radiation (e.g., an IR image). Moreover, example embodiments may provide a fast IR emission material in which the speed of response of the material (e.g., the speed of stopping IR emission after light emission is secured) is controllable based on design features (e.g., CNT length). Example embodiments may be used to test surveillance cameras or other IR devices by simulating IR environments under synthetic conditions. For example, if night vision goggles are being tested in connection with the use of an IR tag that may be placed on the gear of operators, the visibility of the tag may be tested in the lab by simulating corresponding conditions accurately with an IR scene projector of an example embodiment. Similarly, if heat seeking munitions are to be tested, an IR scene projector of an example embodiment may be employed to determine how the munitions detect targets. Enhancement of countermeasure resistance, or even enhancement of countermeasure effectiveness may also be tested using such devices. In some embodiments, the VACN array may alternatively be used to provide a coating for certain materials to impact the detectability of those materials. Example embodiments may provide a very high emissivity and an overall emission spectra that is extremely similar to that of an ideal black-body cavity. Angular measurements of the IR reflection and scattering of some embodiments further indicate that the VACN array behaves in a Lambertian mode.

Many modifications and other embodiments of the inventions set forth herein will come to mind to one skilled in the art to which these inventions pertain having the benefit of the teachings presented in the foregoing descriptions and the associated drawings. Therefore, it is to be understood that the inventions are not to be limited to the specific embodiments disclosed and that modifications and other embodiments are intended to be included within the scope of the appended claims. Moreover, although the foregoing descriptions and the associated drawings describe exemplary embodiments in the context of certain exemplary combinations of elements and/or functions, it should be appreciated that different combinations of elements and/or functions may be provided by alternative embodiments without departing from the scope of the appended claims. In this regard, for example, different combinations of elements and/or functions than those explicitly described above are also contemplated as may be set forth in some of the appended claims. In cases where advantages, benefits or solutions to problems are described herein, it should be appreciated that such advantages, benefits and/or solutions may be applicable to some example embodiments, but not necessarily all example embodiments. Thus, any advantages, benefits or solutions described herein should not be thought of as being critical, required or essential to all embodiments or to that which is claimed herein. Although specific terms are employed herein, they are used in a generic and descriptive sense only and not for purposes of limitation.

What is claimed is:

1. An infrared (IR) scene projector device comprising:
a light emitter configured to selectably provide visible light; and
a thermal emitter comprising a vertically aligned carbon nanotube (VACN) array, the VACN array comprising a plurality of carbon nanotubes disposed proximate to a thermally conductive substrate such that a longitudinal axis of the carbon nanotubes extends substantially perpendicular to a surface of the substrate, the thermal emitter absorbing the visible light from the light emitter and converting the visible light from the light emitter into IR radiation.

2. The scene projector device of claim 1, wherein the light emitter comprises a point source.

3. The scene projector device of claim 2, wherein the point source comprises a pulsed laser.

4. The scene projector device of claim 1, wherein the light emitter comprises a plurality of parallel sources.

5. The scene projector device of claim 1, wherein the light emitter comprises a scanning system.

6. The scene projector device of claim 5, wherein the scanning system comprises a galvo scanner.

7. The scene projector device of claim 5, wherein the scanning system comprises a mask.

8. The scene projector device of claim 1, further comprising a light controller configured to control operation of the light emitter.

9. The scene projector device of claim 8, wherein the light controller includes processing circuitry configured to control the light emitter to encode images for provision onto the thermal emitter.

10. The scene projector device of claim 8, wherein the light controller includes processing circuitry configured to control the light emitter to define a two dimensional thermal pattern at the thermal emitter.

11. The scene projector device of claim 8, wherein the light controller includes processing circuitry configured to execute an application programmable to define an IR scenario to be simulated via selective scanning of the light emitter.

12. The scene projector device of claim 1, wherein a laser pulse energy of the light controller is variable in order to adjust a thermal signature produced by the thermal emitter.

13. The scene projector device of claim 1, wherein a response time of the thermal emitter is selectable based on selection of carbon nanotube length.

14. The scene projector device of claim 1, wherein a longitudinal length of each of the carbon nanotubes is greater than or equal to about 10 μm and a diameter of each of the carbon nanotubes is less than or equal to about 30 nm.

15. The scene projector device of claim 1, wherein light from the light emitter is spatially modulated or image encoded.

16. A thermal emission array comprising:
a thermally conductive substrate; and
a plurality of vertically aligned carbon nanotubes (VACN), the carbon nanotubes being disposed proximate to the thermally conductive substrate such that a longitudinal axis of the carbon nanotubes extends substantially perpendicular to a surface of the substrate,
wherein the carbon nanotubes convert visible light directed thereon into IR radiation, the IR radiation being emitted by thermal emission array based on selective provision of the visible light to the VACN.

17. The thermal emission array of claim 16, wherein a laser pulse energy providing a light source to the thermal emission array is variable in order to adjust a thermal signature produced by the thermal emitter.

18. The thermal emission array of claim 16, wherein a response time of the thermal emission array is selectable based on selection of carbon nanotube length.

19. The thermal emission array of claim 16, wherein a longitudinal length of each of the carbon nanotubes is greater than or equal to about 10 μm and a diameter of each of the carbon nanotubes is less than or equal to about 30 nm.

20. The thermal emission array of claim 16, wherein broadband black-body like IR thermal emission of spatially modulated or image encoded light is provided by the VACN.

* * * * *